(12) United States Patent
Manhaeve et al.

(10) Patent No.: US 7,315,180 B2
(45) Date of Patent: Jan. 1, 2008

(54) DEVICE FOR MONITORING QUIESCENT CURRENT OF AN ELECTRONIC DEVICE

(75) Inventors: Hans Manhaeve, Sint-Michiels (BE); Stefaan Kerckenaere, Eernegem (BE); Bohumil Straka, Brno (CZ)

(73) Assignee: Q-Star Test N.V., Bruges (BE)

( * ) Notice: Subject to any disclaimer, the term of this patent is extended or adjusted under 35 U.S.C. 154(b) by 0 days.

(21) Appl. No.: 11/085,027

(22) Filed: Mar. 15, 2005

(65) Prior Publication Data

US 2005/0156619 A1    Jul. 21, 2005

Related U.S. Application Data

(62) Division of application No. 10/613,260, filed on Jul. 3, 2003, now Pat. No. 6,927,592.

(30) Foreign Application Priority Data

Jul. 3, 2002   (EP)  .................................. 02447125

(51) Int. Cl.
*G01R 31/26* (2006.01)

(52) U.S. Cl. ..................................... 324/765; 324/158.1

(58) Field of Classification Search ...................... None
See application file for complete search history.

(56) References Cited

U.S. PATENT DOCUMENTS 3,754,442 A * 8/1973 Arnett ......................... 374/173
5,057,774 A * 10/1991 Verhelst et al. ............. 324/537

(Continued)

FOREIGN PATENT DOCUMENTS

EP    0 386 804    9/1990

(Continued)

OTHER PUBLICATIONS

Straka et al. "A fully digital controlled off-chip $I_{DDQ}$ measurement unit". Automation and Test in Europe, 1998. Proceedings Paris, France, Feb. 1998, Los Alamitos, CA, *IEEE Comput. Soc, US*, pp. 495-500 (Feb. 23, 1998).

(Continued)

*Primary Examiner*—Paresh Patel
(74) *Attorney, Agent, or Firm*—Merchant & Gould P.C.

(57) ABSTRACT

The present invention is related to a device (1) for measuring the quiescent current $I_{DDQ}$ drawn by an electronic device such as a CMOS device or an IC, from a supply voltage. The quiescent current is drawn in between switching peaks, and is a measure for the quality of a device under test. The measurement device of the invention comprises a current measuring unit (6), and parallel to this CMU (6), a current bypass unit CBU (20), comprising a power MOSFET. In the CBU of the invention, a connection (51) is present between a terminal other than the gate or base of one driver transistor and the source of the MOSFET, thereby minimising the charge transfer effects which are likely to occur during switching of the MOSFET. The invention is further related to a measurement device for IDDQ measurement comprising a current offset unit (21), which is aimed at improving the measurement range, without losing measurement resolution.

10 Claims, 8 Drawing Sheets

U.S. PATENT DOCUMENTS

| | | | |
|---|---|---|---|
| 5,392,293 A * | 2/1995 | Hsue | 324/765 |
| 5,483,170 A | 1/1996 | Beasley et al. | |
| 5,721,495 A * | 2/1998 | Jennion et al. | 324/765 |
| 5,731,700 A * | 3/1998 | McDonald | 324/158.1 |
| 5,818,268 A | 10/1998 | Kim et al. | |
| 5,914,615 A | 6/1999 | Chess | |
| 6,118,293 A * | 9/2000 | Manhaeve et al. | 324/765 |
| 6,342,790 B1 * | 1/2002 | Ferguson et al. | 324/765 |
| 6,414,511 B1 | 7/2002 | Janssen et al. | |
| 6,424,211 B1 * | 7/2002 | Nolan et al. | 330/2 |
| 6,441,633 B1 | 8/2002 | Manhaeve et al. | |
| 6,496,028 B1 * | 12/2002 | Manhaeve et al. | 324/763 |
| 6,664,801 B1 | 12/2003 | Palusa | |
| 6,859,058 B2 * | 2/2005 | Manhaeve et al. | 324/763 |

FOREIGN PATENT DOCUMENTS

| | | |
|---|---|---|
| EP | 0 672 911 | 9/1995 |
| EP | 0 811 850 | 12/1997 |
| EP | 1 107 013 | 6/2001 |
| WO | WO 98/15844 | 4/1998 |

OTHER PUBLICATIONS

Su et al. "Transient power supply current monitoring-a new test method for CMOS VLSI circuits". *Journal of Electronic Testing: Theory and Applications*, vol. 6, No. 1, pp. 23-43 (1995).

Eichenberger et al. "On Charge Injection in Analog MOS Switches and Dummy Switch Compensation Techniques". *IEEE Transactions on Circuits and Systems*, vol. 37, No. 2, pp. 256-264 (Feb. 1990).

Eichenberger et al. "Dummy Transistor Compensation of Analog MOS Switches". *IEEE Journal of Solid-State Circuits*, vol. 24, No. 4, pp. 1143-1146 (Aug. 1989).

* cited by examiner

PRIOR ART

US 7,315,180 B2

DEVICE FOR MONITORING QUIESCENT CURRENT OF AN ELECTRONIC DEVICE

This application is a division of application Ser. No. 10/613,260 filed on Jul. 3, 2003, now U.S. Pat. No. 6,927,592, which application is incorporated herein by reference.

FIELD OF THE INVENTION

The present invention is related to a device for measuring the quiescent current ($I_{DDQ}$) drawn by an electronic device, such as a CMOS device or an Integrated Circuit, when the device is powered by a supply voltage ($V_{DD}$).

STATE OF THE ART

Integrated circuits need to be thoroughly tested. The current drawn by a powered CMOS device or IC, when it is not in switching mode, is called the 'quiescent current', described by the symbol $I_{DDQ}$. It is known that the value of this current is a very sensitive criterion for identifying possible malfunctioning of the IC. The detection of the $I_{DDQ}$ level, and the comparison of this level with a reference, allows a straightforward pass/fail decision to be made on the quality of the device under test. Several devices and methods for $I_{DDQ}$ measurement have been described so far.

Document EP-A-672911 describes an $I_{DDQ}$ test device for a CMOS device, said test device comprising a stabilized voltage source, and a current measurement circuit, which is coupled to said source.

Document WO-A-9815844 is related to a method for inspecting an integrated circuit, wherein the supply current is measured, by measuring the voltage over a segment of the supply line through which this supply current flows.

Document EP-A-811850 is related to a system for the measurement of a supply current of an electronic circuit, comprising a bypass switch with a dummy transistor to avoid charge transfer.

Document EP-A-1107013 is related to a device for testing a supply connection of an electronic device, said test device comprising a current mirror.

Whatever the way in which the quiescent current is detected and/or measured, one of the major issues of $I_{DDQ}$ measurement is that dedicated $I_{DDQ}$ monitors must measure a very low quiescent current (in the order of microamps), while they must be able to deliver the high transient current (about a million times higher; in the order of amps) which is generated when a new test vector is applied to a Device Under Test (DUT). A test vector is defined as a digital input to the DUT, applied during a clock cycle of the DUT, and causing one or more transistors on the DUT to operate, yielding a digital output.

When the test vector is applied, the inputs of the DUT are changed, which flips the internal logic. During the switching of the logic, internal capacitances are charged and discharged, which appears as a peak in the supply current. This is usually solved employing a bypass switch, which is turned on prior to the transient spike. The bypass switch, together with the DUT decoupling capacitor $C_H$, ensures that the operation of the DUT is not affected during this critical period. The bypass having a low $R_{ON}$ resistance prevents the DUT supply from dropping to a low value, which might bring the DUT to an unknown state, as a consequence of which the test vector would no longer be valid. A power MOSFET is usually used as a bypass switch. By selecting a MOSFET switch with a low on-resistance the voltage drop due to its inherent on-resistance can be kept to a minimum. Unfortunately, MOSFET switches exhibit parasitic capacitances that must be considered at high speed. Charge injection of the MOSFET creates a voltage peak, when it is switched off at the end of the bypass mode. The settling takes time and prolongs the measurement period. This peak can cause momentary voltage drops of 5-10%, which can affect the operation of the DUT at high speeds. The challenge is how to cope with these parasitics that cause undesired clock feed-through and hence to avoid the switched circuit to be affected by the control signal.

Many charge injection cancellation techniques have been found so far. They are mostly based on a dummy switch or capacitor, such as for example in document EP-A-811850. These solutions are described in detail in the documents:

"On Charge Injection in Analog MOS Switches and Dummy Switch Compensation Techniques", C. Eichenberger, W. Guggenbuhl, IEEE Transactions on Circuits and Systems, pp. 256-264, vol. 37, No. 2, February 1990.

"Dummy Transistor Compensation of Analog MOS Switches", C. Eichenberger, W. Guggenbuhl, IEEE Journal of Solid-State Circuits, Vol. 24, No. 4, pp. 1143-1146, August 1989.

The dummy is usually driven by an opposite clock and so it compensates the charge injection by the opposite charge injection, which results in the cancellation. The main disadvantage is that the cancellation strongly depends on proper matching and actual type of MOSFET. These techniques cannot be applied in designs with discrete components, because single components have a much higher dispersion of parameters than matched on-chip components.

In the article 'A fully digital controlled Off-Chip $I_{DDQ}$ measurement unit', Straka et al., 1998, a measurement unit is disclosed which exhibits reduced sensitivity to charge injection, due to an auxiliary circuit which reduces the peaks approximately 5 to 10 times in comparison with an uncompensated bypass switch. In particular, the compensation is achieved through a special design of the MOSFET bypass switch and the inverter or driver follower through which the switch is activated. Such an inverter or driver follower basically consists of a series connection of two transistors whose gates or bases are connected to a clock pulse. According to the cited article, the transistors in question are not referred to ground but they are connected to the drain of the MOSFET switch, thereby achieving a charge compensation effect (see further in description). However, the overshoot peaks are not eliminated, and especially for low $I_{DDQ}$ current levels, they can cause erroneous overcurrent alarms.

Another problem of existing $I_{DDQ}$-monitors is related to the sensitivity of these test devices. The background leakage current ($I_{Background\ Leakage}$) of deep sub-micron devices increases drastically as process technologies are decreasing in size and the number of transistors contributing to the background leakage is increasing drastically, whereas the order of magnitude of the defect current ($I_{Defect\ Leakage}$) remains more or less constant:

$$I_{Total\ Leakage}(\to) = I_{Background\ Leakage}(\to) + I_{Defect\ Leakage}$$

In order to distinguish the small defect leakage component from the background leakage current, the measurement resolution must be very high throughout the measurement range of the monitor. People skilled in the art know that increasing the measurement range is always done at the expense of measurement resolution. Yet the resolution should remain constant as the defect leakage current remains constant. Existing IDDQ monitors do not offer a solution to this problem.

AIMS OF THE INVENTION

The present invention aims to provide a device for $I_{DDQ}$ monitoring of electronic devices, which comprises improved means to reduce the influence of parasitic capacitances of the bypass switch, and/or which has a high resolution for higher $I_{DDQ}$ levels. The device of the application is capable of being used both in on-chip and off-chip applications.

SUMMARY OF THE INVENTION

The invention is related to an IDDQ monitor with specific combinations of components such as described in the appended claims.

In particular, the present invention is related to a device for measuring the supply current ($I_{DDQ}$) to an electronic device under test DUT, which is powered by a supply voltage ($V_{DUT}$), said measuring device being placed in a supply line between said supply voltage and said device under test, said measuring device comprising a current measuring unit CMU, a current bypass unit or CBU in parallel to said CMU, said CBU comprising a power MOSFET in the path between said supply voltage ($V_{DUT}$) and said DUT, said CBU further comprising means to receive a clock signal, being a succession of high and low states, said CBU comprising two transistors connected by a series connection, which receive said clock signal at their gates or bases, the gate of said MOSFET being connected to said series connection, wherein a connection is present between one terminal other than the gate or base of one of said transistors in series, and the source of said MOSFET.

According to a first embodiment, said two transistors are respectively a P-MOS transistor and an N-MOS transistor.

According to a second embodiment, said two transistors are bipolar transistors, respectively a PNP transistor and an NPN transistor.

Said two transistors in series may be arranged as an inverter or as a follower driver.

Said CBU may further comprise a diode, coupled in parallel to said MOSFET switch.

The invention is equally related to a device for measuring the supply current ($I_{DDQ}$) to an electronic device under test, which is powered by a supply voltage ($V_{DUT}$), said measuring device being placed in a supply line between said supply voltage and said device under test, said measuring device comprising a current measuring unit or CMU, a current bypass unit or CBU in parallel to said CMU, wherein said measuring device further comprises an offset current device, said offset current device comprising a current source, for providing a constant offset current to said DUT.

Said current source is preferably programmable. It may be coupled in parallel to said current measuring unit, or it may be powered by a supply voltage ($V_{DD}$) which is different from the DUT supply voltage ($V_{DUT}$).

Any device according to the invention may further comprise a processing unit, which is in connection with said current measuring unit and with an output device and which is able to acquire an $I_{DDQ}$ measured value from the CMU, wherein the processing unit is able to perform processing actions on said measurement.

Said processing actions are preferably chosen from the group consisting of:

subtracting a measured $I_{DDQ}$ value from a reference value or vice versa, comparing a measured $I_{DDQ}$ value with a reference value and producing a pass/fail signal on the basis of the result of said comparison, subtracting a measured $I_{DDQ}$ value from a previously measured $I_{DDQ}$ value comparing a calculated value, resulting from subtracting a measured $I_{DDQ}$ value from a previously measured $I_{DDQ}$ value or vice versa, or from subtracting a measured $I_{DDQ}$ value from a reference value or vice versa, with a reference value and producing a pass/fail signal on the basis of the result of said comparison.

A device of the invention may be separate from said device under test, or it may be incorporated into said device under test.

SHORT DESCRIPTION OF THE DRAWINGS

Figure 6:
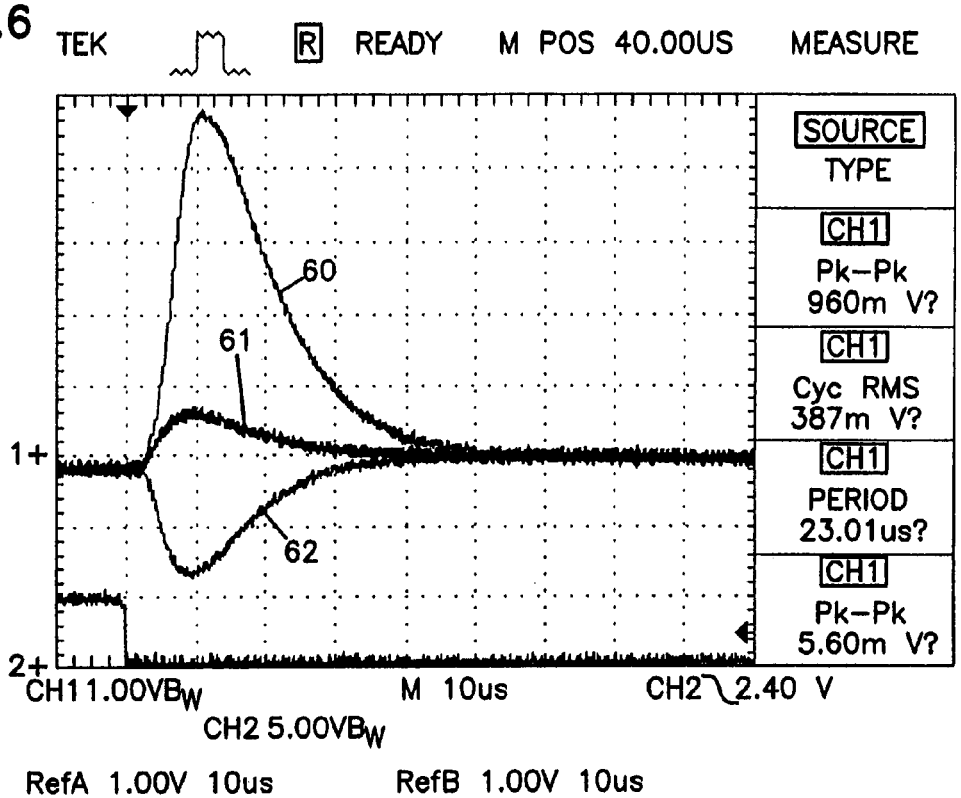

FIG. 6 compares the output voltages of a current measurement unit, equipped with different bypass units.

Figure 7A:
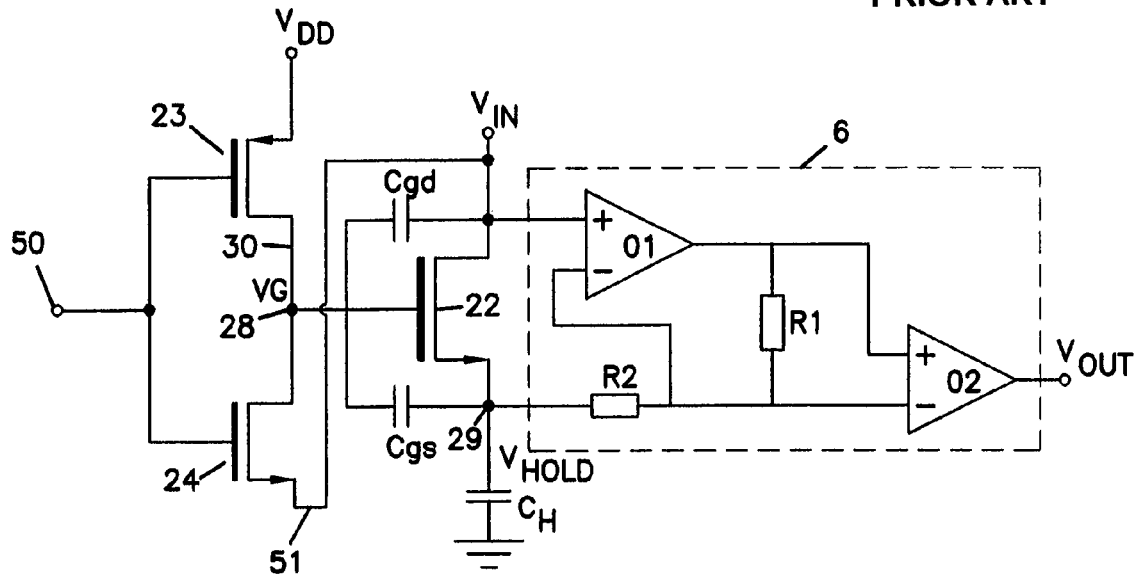
Figure 7B:
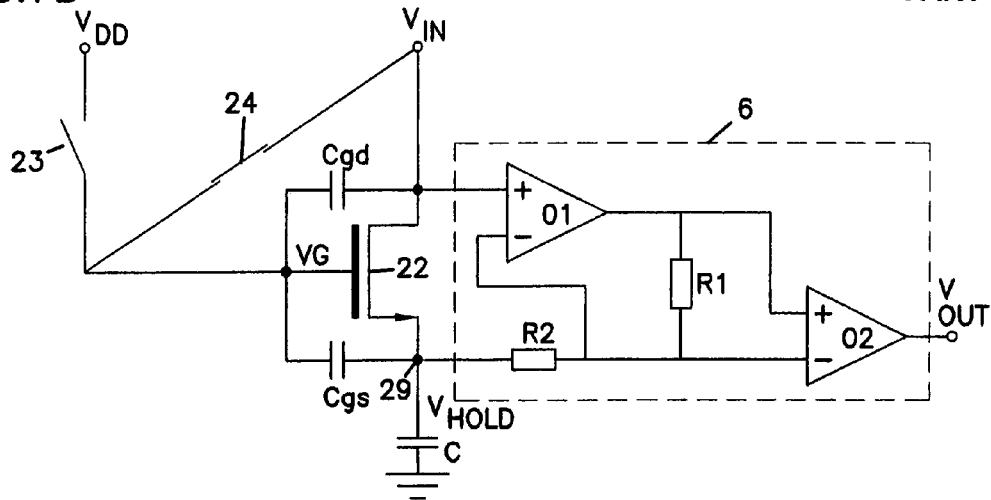

FIGS. 7a and 7b show a prior art current bypass unit, in combination with a given current measurement unit.

Figure 8A:
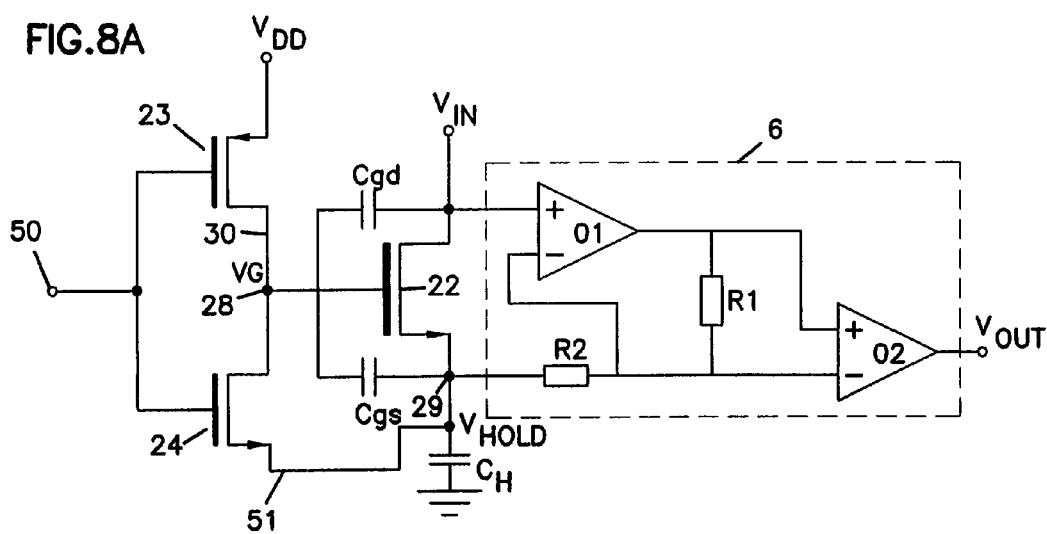
Figure 8B:
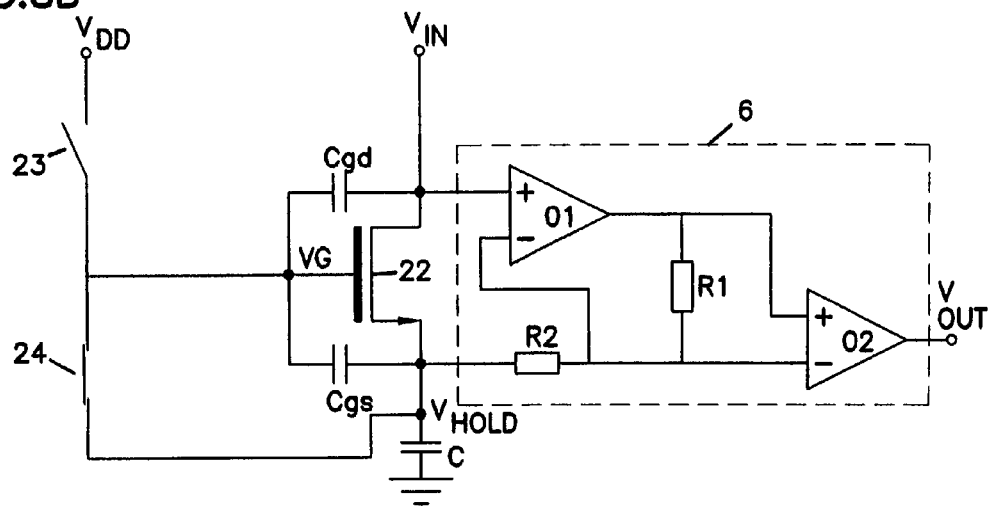

FIGS. 8a and 8b show a current bypass unit of the invention, in combination with a given current measurement unit.

Figure 9:
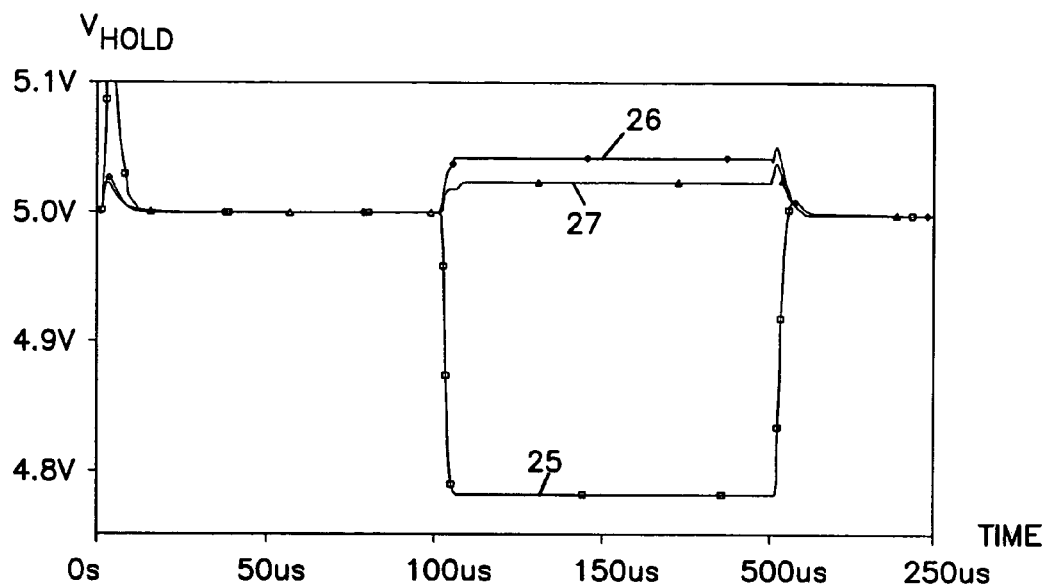

FIG. 9 illustrates the result of a simulation-based comparison between a bypass switch of the prior art and a bypass switch of the invention.

Figure 10A:
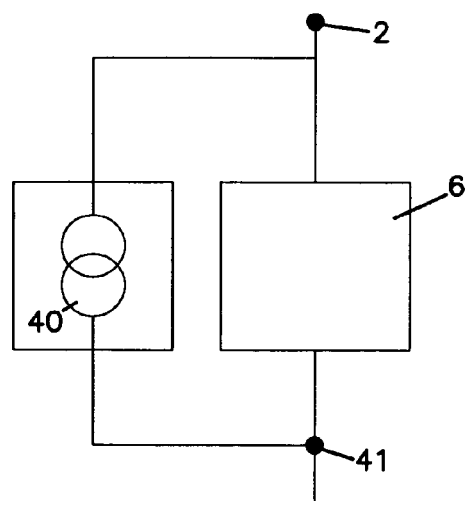
Figure 10B:
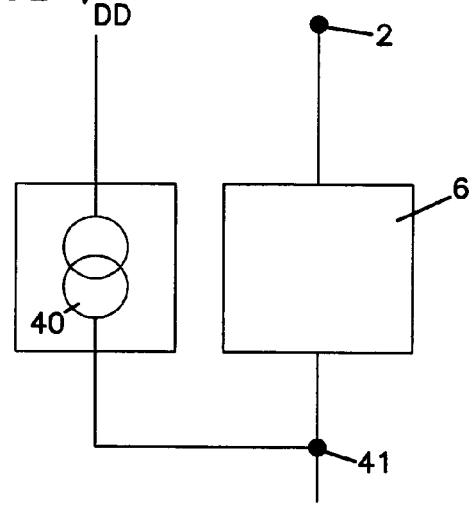

FIGS. 10a and 10b represent schematic views of two embodiments of the current offset unit according to the invention.

Figure 11:
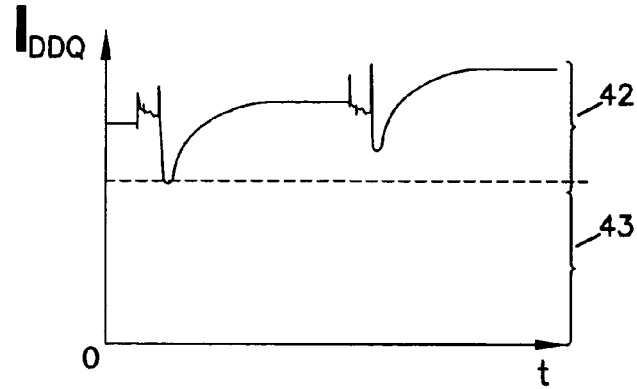
Figure 12A:
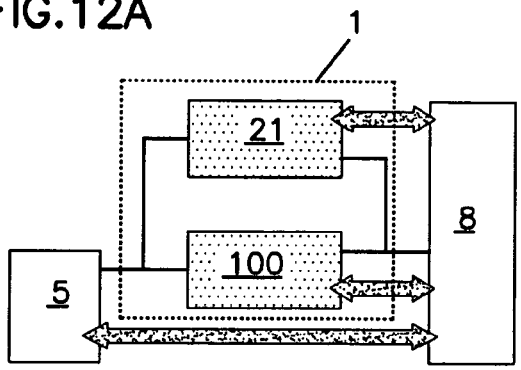
Figure 12B:
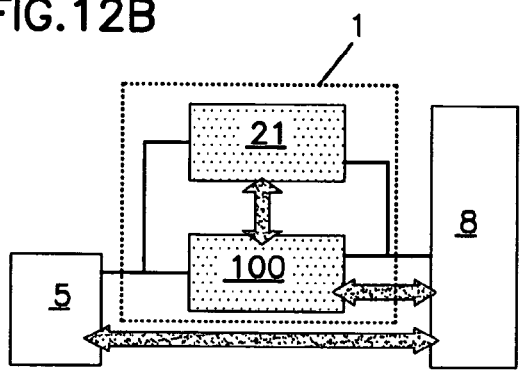
Figure 13A:
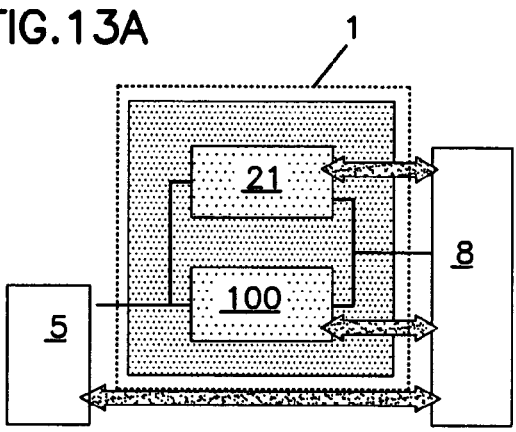
Figure 13B:
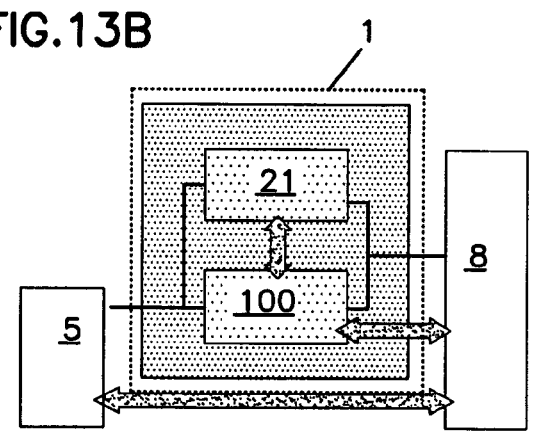
Figure 14A:
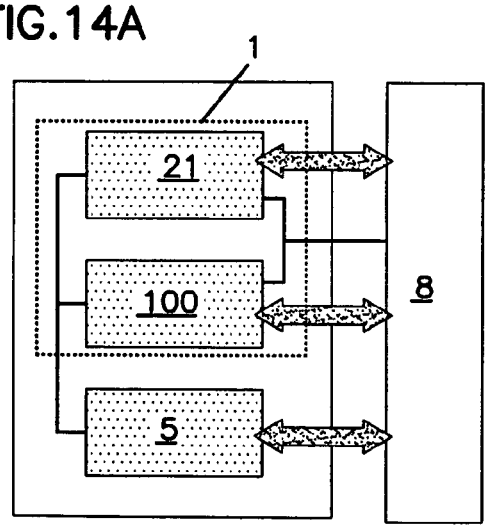
Figure 14B:
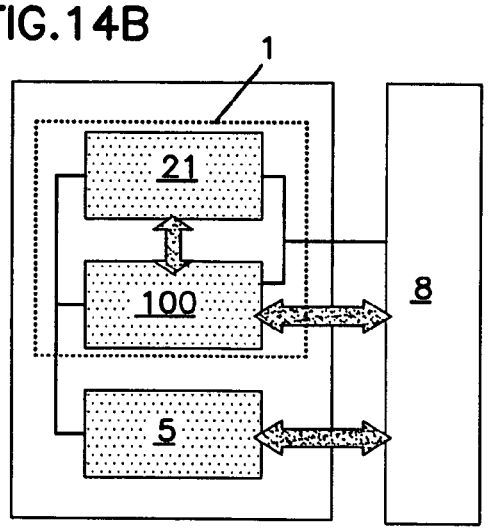
Figure 15A:
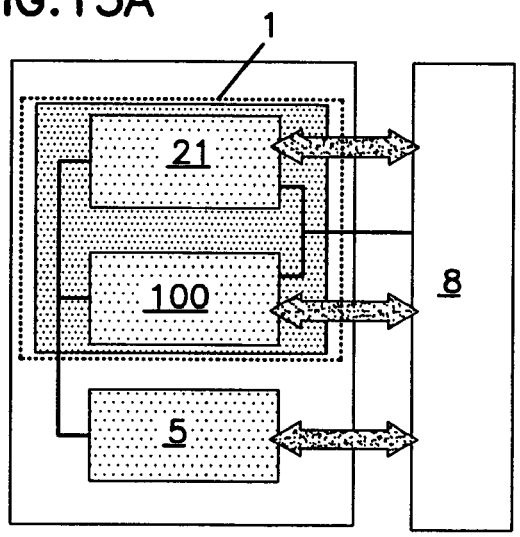
Figure 15B:
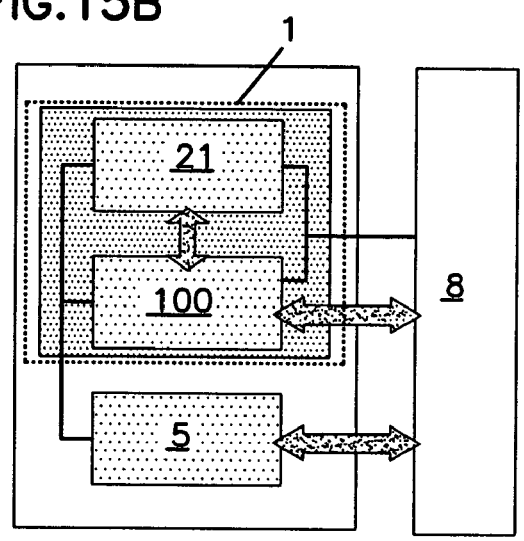

FIG. 11 represents a graph, illustrating the application of a virtual measurement window to the leakage current, by using a monitor according to the invention.

FIGS. 12 to 15 illustrate different off-chip and on-chip embodiments of a device according to the invention.

DETAILED DESCRIPTION OF THE INVENTION

Figure 1:
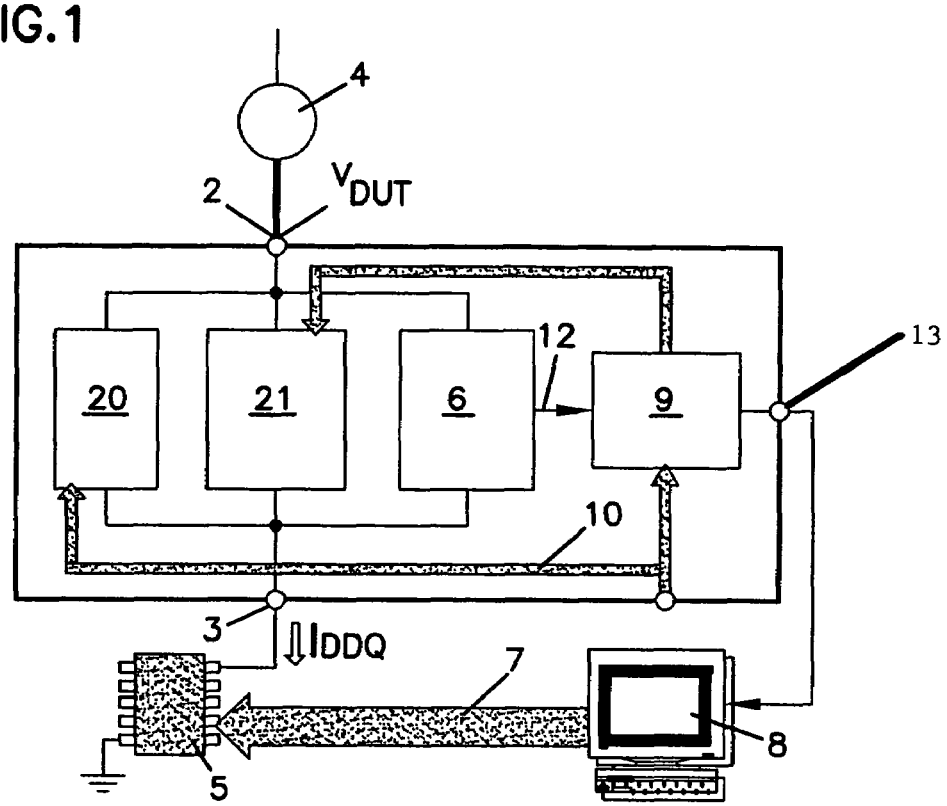
FIG. 1 represents a schematic view of an $I_{DDQ}$ monitor according to the invention.

FIG. 1 illustrates a schematic view of an $I_{DDQ}$ monitoring device or simply named 'monitor' 1, according to the invention. In this figure, the monitor is represented as a separate device, which can for example be incorporated into the test equipment, as a load-board application. It is emphasized that the same monitor can be designed as an on-chip device.

The monitor 1 is connected by two terminals 2 and 3, between a supply voltage source 4, and the Device-Under-Test DUT 5. The supply voltage $V_{DUT}$ at the terminal 2 should be present also, with a minimum error, on the terminal 3, in order to create a maximum transparency of the monitor 1.

The measurement of the $I_{DDQ}$ is performed by the current measuring unit CMU 6, during a non-switching state of the DUT. Test vectors 7 are applied to the DUT at a given clock frequency, by the test equipment 8. The CMU 6 may be a unit working according to the stabilized voltage source principle or any other prior art measurement method. A current bypass unit CBU 20 is placed parallel to the CMU 6. The CBU 20 preferably comprises a power MOSFET which can be closed prior to the occurrence of the transient peak resulting from the DUT's switching action. This transient peak occurs when a test vector is applied to the DUT or when the application of a clock cycle of the DUT's operational clock causes the DUT to change state. In between transient peaks and for the desired measurement states, the MOSFET is normally opened in order to send the quiescent current $I_{DDQ}$ through the current measuring unit CMU 6.

The CBU 20 of the invention is new and inventive with respect to the prior art, and described in more detail in the following paragraphs. Another block 21 may be present in the $I_{DDQ}$ monitor of the invention. This is an offset current unit OCU 21, characteristic to the present invention and described at length further in this description. The operation of the CBU 20 and OCU 21 is controlled by the processing unit 9, via control signals 10 and 11. In particular, the PU 9 controls the opening and closing of the MOSFET incorporated in the CBU 20, on the basis of a clock signal derived from the clock with which the DUT is operated. The clock applied to the CBU is dependent on the relevant measurement sequence: there is not necessarily a measurement during every clock cycle of the DUT. When in measurement mode, the current measuring unit performs an $I_{DDQ}$ measurement, during a non-switching period of the DUT and delivers a signal 12 related to the $I_{DDQ}$ level, to the processing unit 9, which digitises the signal, and transmits it via the terminal 13, to the test equipment 8.

The test equipment 8 controls the processing unit 9, and processes the monitor's output 12, so that the result of the $I_{DDQ}$ measurement is displayed on a screen. In the preferred set-up, the source 4 is not separate, and the supply voltage $V_{DUT}$ is equally supplied by the test equipment 8. The displayed result is at least a pass/fail statement based on the comparison between the measured $I_{DDQ}$ value and a predefined reference, often completed by the measured value of $I_{DDQ}$. Other measurement modes can be selected when using the preferred version of the processing unit 9. For example: the measurement of current signatures or a delta $I_{DDQ}$ measurement mode wherein subsequent measurements are subtracted and the delta-values obtained are memorized and compared to a reference.

According to a preferred embodiment of the invention, the PU 9 itself performs the processing of the incoming signals, for example the subtraction of two subsequent $I_{DDQ}$ measurement values, before a result is transferred to the test equipment 8. Some examples of measurement modes, performed by a PU according to this embodiment, are given further in this description.

As mentioned already, the CBU 20 comprises a switch, preferably a power MOSFET with a low $R_{ON}$ resistance, aimed at bypassing the $I_{DDQ}$ measurement unit during the transient peaks of the supply current drawn by the DUT 5. Such a MOSFET, together with the loading-decoupling capacitance $C_H$, creates a generic sample/hold circuit. The CBU of the invention comprises new and inventive means to compensate for charge transfer phenomena.

Figure 2:
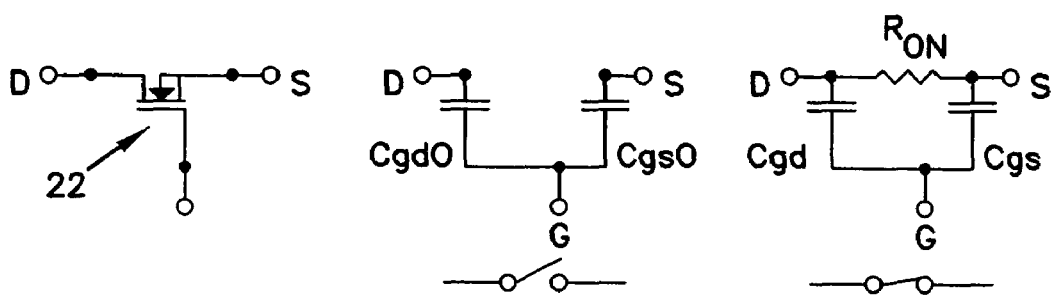
FIG. 2 represents illustrates the parasitic capacitances $C_{gd}$ and $C_{gs}$ of a power MOSFET transistor.

A simplified high-speed model of a MOSFET switch 22 involves an on-resistance $R_{ON}$ and two parasitic gate capacitances $C_{gd}$ and $C_{gs}$ as shown in FIG. 2. The resistance in the off-state can be considered infinite. The parasitic capacitances can reach values significantly higher than 1 nF in case of discrete power MOSFETs, but a typical value is in order of pF or less.

Figure 3:
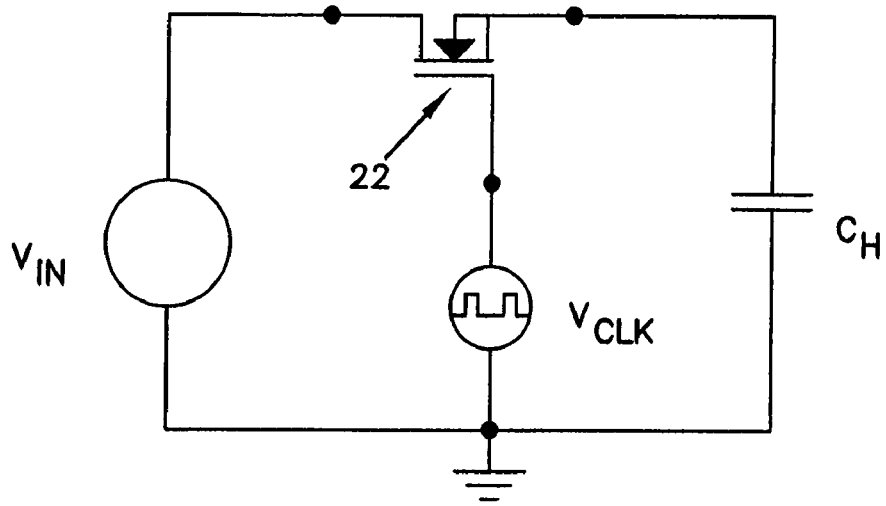
FIG. 3 illustrates the principle of a sample-hold circuit.

During MOSFET switching, a charge is injected from the gate through the drain and the source via $C_{gd}$ and $C_{gs}$. Therefore the load connected to the drain or the source is directly affected by the control signal (clock) applied to the gate. The charge injection is not so important for MOSFET switches in digital circuits, but it is a dominant issue for analogue switch applications especially for sample/hold circuits (S/H). The generic S/H circuit (FIG. 3) involves an input voltage source $V_{IN}$, which is sampled by the MOSFET switch 22 and held by the hold capacitor $C_H$.

The sample/hold mode is controlled by the clock signal $V_{CLK}$, which is applied to the gate of the switch. In the ideal case, the voltage at $C_H$ would be the same as the sampled input voltage $V_{IN}$. In reality however, the change of the gate voltage invokes a change of parasitic $C_{gs}$ charge, which is injected to $C_H$. Naturally, the change of $C_H$ charge results in the change of the hold voltage across the hold capacitor so that this sampled value is not equal to $V_{IN}$. The actual error depends on the ratio between $C_H$ and $C_{gs}$. $C_{gs}$ and $C_H$ are connected in series from the gate point of view. The $C_{gd}$ parasitic capacitance can be neglected in this case, since this is discharged through $V_{IN}$, which is considered to be of low impedance. The total gate capacitance referred to ground is $$C_g = \frac{C_{gs} \cdot C_H}{C_{gs} + C_H}, \tag{1}$$

while the charge injection is $\Delta Q = C_{gs} \cdot \Delta V_G$ and similarly $\Delta Q = C_H \cdot \Delta V_H$.

Therefore, the hold voltage error is $$\Delta V_H = \frac{C_{gs}}{C_{gs} + C_H} \cdot \Delta V_G \tag{2}$$

and this can be further simplified for $C_H \gg C_{gs}$ $$\Delta V_H = \frac{C_{gs}}{C_H} \cdot \Delta V_G. \tag{3}$$

The formulas above assume the simplified model with a constant $C_{gs}$ value. In reality, $C_{gs}$ is a function of the voltage across the gate and the source. The on-state capacitance is higher than the off-state capacitance. As long as the MOSFET is in the on-state, the charge injection is eliminated by the on-resistance. The $C_{gs}$ causes the injection mainly when the MOSFET is being switched off.

Figure 4:
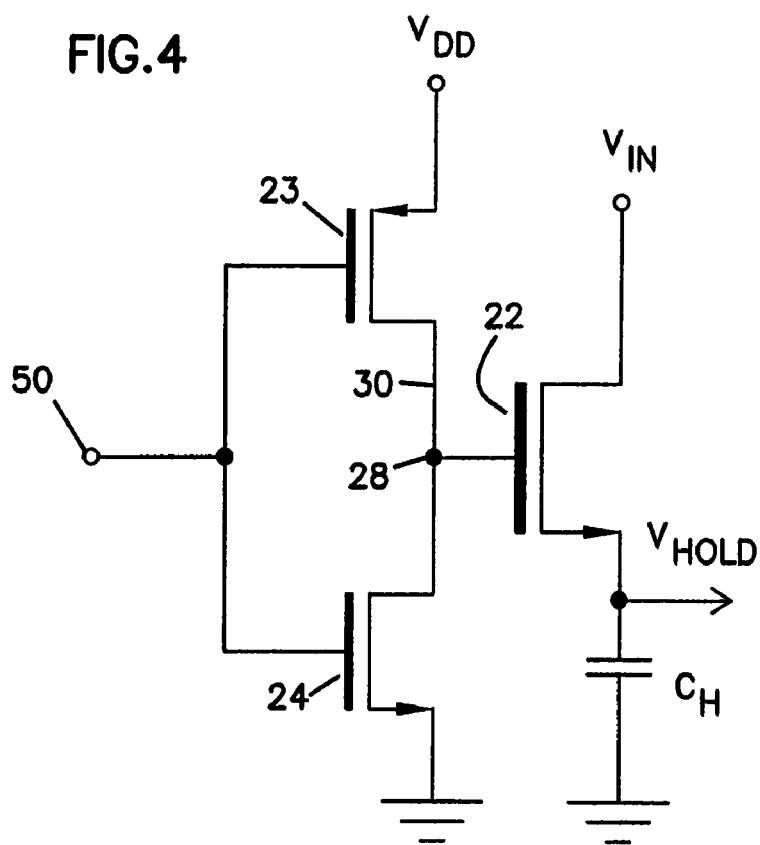
FIG. 4 illustrates a bypass switch, such as it is used in state of the art applications.

FIG. 4 shows a normal uncompensated S/H with an inverter, comprising P-MOS and N-MOS transistors 23 and 24 respectively, connected by a series connection 30. This inverter drives the switch's gate in a traditional way. The clock pulse 50 is synchronised with the DUT's operational clock. The inverter makes sure that during a high state of the pulse 50, the gate of the MOSFET 22 is low, i.e. the MOSFET is open (CBU off, measurement mode). When the clock signal 50 goes low, the MOSFET's gate goes high, i.e. the MOSFET is closed (CBU on, bypass mode). The transistors 23 and 24 are respectively off and on during a high clock pulse and vice versa during a low clock pulse, thereby changing the gate voltage at point 28 between a low and high value, so as to switch the MOSFET 22 off and on alternately. When used in an $I_{DDQ}$ monitor, the voltage $V_{IN}$ is the $V_{DUT}$ voltage, and $V_{DD}$ is an external supply voltage of the CBU. The high gate voltage, applied during a low state of the clock signal 50, is virtually equal to the driver supply voltage $V_{DD}$. Naturally, $V_{DD}$ must be high enough to switch the MOSFET 22 on. When the clock 50 goes high, in order to open the MOSFET 22 (i.e. to switch it off), the MOSFET gate voltage is referred to ground and driven below the $V_{HOLD}$ level, which is virtually equal to $V_{IN}$. This is the drawback, because the charge is fully transferred to the hold capacitor $C_H$, due to the high gate voltage change $\Delta V_G$ that takes place upon opening the MOSFET switch 22 (see formula (3) above).

Figure 5A:
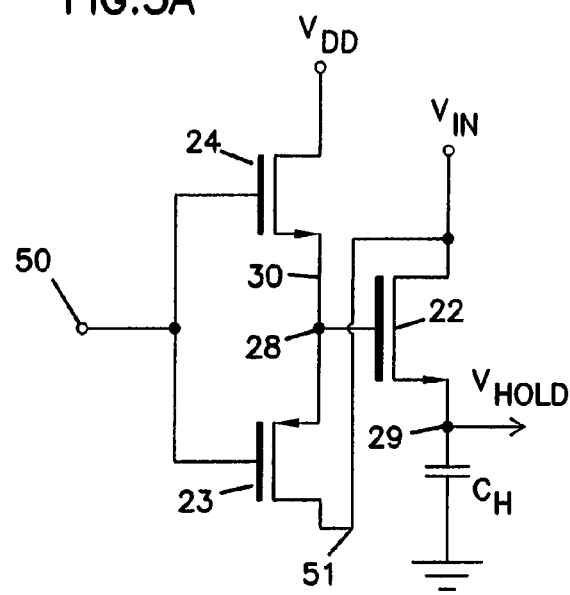
FIG. 5a, FIG. 5b and FIG. 5c show embodiments of a bypass switch according to the present invention.

FIG. 5*a* shows the structure of the CBU according to the article by Straka et al. In the device of FIG. 5*a*, a driver/follower consisting of a P-MOS driver 23 and N-MOS driver 24 is driving the MOSFET. The source of the P-MOS 23 is connected via connection 51, to the drain of the MOSFET 22, in stead of to ground. As a consequence, the gate voltage of the MOSFET 22 never drops below $V_{IN}$, which is virtually equal to $V_{HOLD}$. Furthermore, during the opening of the switch, the $R_{ON}$ resistance is still momentarily low, before reaching a theoretically infinite value $R_{off}$. $R_{off}$ is only really established as soon as the MOSFET gate voltage drops below the threshold voltage. A short resistive transition time occurs, before the resistance reaches its 'infinite' value. During this transition, a connection is effectively established between the source of the MOSFET, through $R_{ON}$ and connection 51, to the source of the P-MOS 23. This allows the peak voltage at point 29 to be reduced.

However, with a given architecture of the current measurement unit 6 (CMU), the output of the CMU exhibits a slight overshoot at the moment of opening the MOSFET 22. This may cause an overcurrent situation to be erroneously reported, especially for low IDDQ levels. FIG. 7*a* shows a typical architecture of a CMU 6, coupled to the current bypass unit of FIG. 5*a* (equipped with an inverter 23,24 in stead of a follower/driver).

FIG. 6 shows the voltage peaks occurring at the output of the CMU, without any compensation taking place (curve 60) and with the current bypass unit according to FIG. 7*a* (curve 61), i.e. with a connection 51 between the inverter and the drain of the MOSFET. With the design of FIG. 7*a*, the overshoot is visibly reduced but not eliminated. This problem is solved by the design of the present invention.

Figure 5B:
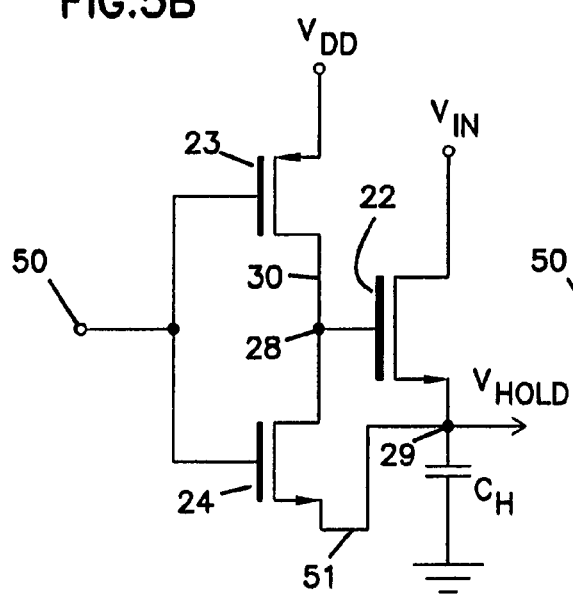

According to a first embodiment, the present invention is related to an IDDQ monitor equipped with a current bypass unit, with the design of FIG. 5*b*. An inverter 23,24 is driving the MOSFET. The source of the N-MOS driver (transistor 24) is connected by connection 51 to the source of the MOSFET switch 22 (in stead of the drain). The gate voltage level of the MOSFET 22 never drops below the MOSFET's (22) source voltage level. Thus, the change of the gate voltage $\Delta V_G$ is limited, which results in a lower charge injection and thus a lower hold voltage error $\Delta V_H$. During switching-off, the parasitic $C_{gs}$ is being discharged directly between the gate and source of the MOSFET, so it does not affect the hold capacitance so much. In the design of FIG. 5*b*, both transistors of the driver inverter are in on-state for a while during the switching activity, which slightly charges the $C_H$ from the supply $V_{DD}$. The embodiment shown in FIG. 5*c* does not suffer from this slight drawback. Here, a follower driver is used in stead of the inverter. The P-MOS 23 and N-MOS 24 have changed places, meaning that the MOSFET's gate 28 is now high during a high clock signal and low during a low clock signal. The particular operation of a driver follower, which is known to the person skilled in the art is such, that the driver transistors are not switched on together during the switching of the MOSFET. This allows a further minimisation of the charge transfer.

When using a current bypass unit according to the invention (FIG. 5*b* or 5*c*), equipped with the same current measurement unit as the one of FIG. 7*a*, the output voltage of that CMU will show a negative peak upon opening the MOSFET switch. This is shown in FIG. 6, curve 62, and explained hereafter.

The main advantage of the CBU of the invention is explained on the basis of FIGS. 7*a-b* and 8*a-b*, which show the same current measurement unit 6, equipped respectively with a CBU according to the prior art (connection 51 to the drain of the MOSFET) and a CBU according to the invention (connection 51 connected to the source of the MOSFET). FIGS. 7*a* and 8*a* show the electrical schematic of the compensated switch including a basic block schematic of the CMU. FIGS. 7*b* and 8*b* show the functional equivalent to explain the switching effects. When the MOSFET 22 is turned off, the gate voltage $V_G$ at 28 switches from $V_{DD}$ to $V_{HOLD}$. This transition occurs in two phases, phase ① and ②

FIGS. 7*a*, 7*b*:

For opening the MOSFET 22, the switches 23 and 24 are opened and closed respectively. In this way, switch 24 makes a short (low impedant path) between the gate and drain of the MOSFET 22. At moment ①, the parasitic capacitance Cgs is fully charged and acts as a hard voltage source Vgs that tries to maintain its voltage ($=V_{DD}-V_{HOLD}$). The terminal $V_G$ is pulled down to $V_{IN}$ through the switch 24. As a consequence, the terminal $V_{HOLD}$ is pushed down by the hard voltage source Vgs. As a result, the weak voltage at $V_{HOLD}$ (~the negative terminal of op-amp O1) decreases and drops below $V_{IN}$ (=the positive terminal of op-amp O1). This triggers the negative feedback loop of the op-amp O1 and it will pull up $V_{HOLD}$ (by injecting charge in $C_H$) so that the voltage level at its negative terminal will become equal again to that of its positive terminal (moment ②). The instrumentation amplifier O2 shows this regulation process with respect to circuit ground. As a result, a positive spike is observed at the CMU output $V_{OUT}$. At moment ② (the settled state), the voltage at VG equals VIN.

FIGS. 8*a*, 8*b*:

Once again, for opening the MOSFET 22, the switches 23 and 24 are opened and closed respectively. In this way, switch 24 makes a short (low impedant path) between the gate and source of MOSFET 22. At moment ①, the parasitic capacitance Cgd is fully charged and acts as a hard voltage source Vgd that tries to maintain its voltage ($=V_{DD}-V_{IN}$). As a consequence, the terminal $V_{HOLD}$ is pulled up to a hard voltage source $V_G$ ($=V_{IN}+V_{gd}>V_{HOLD}$). As a result, the weak voltage at $V_{HOLD}$ (~the negative terminal of op-amp O1) increases and rises above $V_{IN}$ (=the positive terminal of op-amp O1). This triggers the negative feedback loop of the op-amp O1 and it will push down $V_{HOLD}$ (by absorbing charge from $C_H$) so that the voltage level at its negative terminal will become equal again to that of its positive terminal (moment ②. The instrumentation amplifier O2 shows this regulation process with respect to circuit ground. As a result, a negative spike is observed at the CMU output $V_{OUT}$. At moment ② (the settled state), the gate voltage at 28 equals $V_{HOLD}$.

The negative spike in the setup of FIGS. 8a and 8b is crucial in that it will avoid erroneous overcurrent reports. An important advantage of the CBU according to the invention is therefore situated in the fact that for the same architecture of current measurement unit, these faulty overcurrent reports are avoided.

In any embodiment of the invention, the P-MOS and N-MOS transistors 23 and 24 may be replaced by bipolar transistors.

Figure 5C:
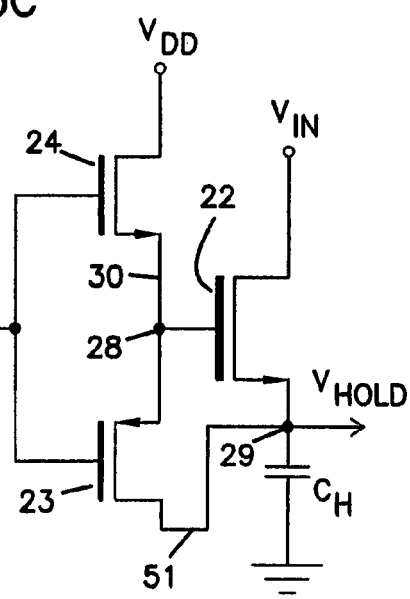

The circuits of FIGS. 5b and 5c were simulated using SPICE. FIG. 9 is a simulation result for the discrete MOSFET switch 22 of type BUZ 11, while the driver transistors 24 and 23 are BS170 and BS250 types respectively. The voltages are $V_{DD}$=10 V, $V_{IN}$=5 V, $C_H$=100 nF, the sample and hold periods are set to 100 μs. The sampling error is approximately 0.25 V in case of uncompensated S/H (curve 25), while the compensated inverter and follower configurations exhibit a much reduced error (curves 26/27). Curve 26 is relevant to the switch of FIG. 5b; curve 27 is relevant to the switch of FIG. 5c. In case the switch of FIG. 4, i.e. without compensation, is used as a current bypass unit in an $I_{DDQ}$ monitor, the voltage drop at the DUT side will be in the range of 5-10%. This voltage drop can cause the DUT to malfunction or might result in data loss in memory elements. A compensated switch causes the DUT voltage to increase slightly, 0.5-1.0%. However, this is less harmful for the DUT operation.

Since this approach is versatile, error reduction (cancellation) factors of 8 to 30 times were reached under various conditions—for different input voltage $V_{IN}$, with different transistors etc. The only requirement is that the driver transistors must be much smaller (with much lower parasitic capacitances) than the sample switch. Similar results were reached with on-chip transistors. Models used CMOS technology ES2 1.5 μm with dimensions of 1000 μm/5 μm for MOSFET switch and 20 μm/5 μm for the driver transistors.

Block 21 shown in FIG. 1 is equally a characteristic element of the invention. This is the Offset Current Unit (OCU). As the large background leakage current does not contain any defect information, it is not practical to measure this component of the leakage current. In practice, the background leakage current can be of the order of 100 mA, while the defect-related leakage current $I_{DDQdefect}$ is typically between 0 and 10 mA. The background leakage component can therefore be regarded as an offset current ($I_{DDQoffset}$). The total quiescent current $I_{DDQ}$ is the sum of both previously described components.

$$I_{DDQ}=I_{DDQBackground}+I_{DDQDefect}$$

Measuring the totality of this $I_{DDQ}$ current, requires a CMU with a high dynamic range, and thus reduced sensitivity. As stated above, this is a growing problem, due to increasing background leakage current in submicron devices, while the defect leakage current remains of the same order. The total $I_{DDQ}$ level becomes too high for a current measuring unit, having a high resolution, as is desired for reasons of accuracy. It would therefore be advantageous if only the defect leakage component is measured. As shown schematically in FIG. 10, the OCU 21 is actually a current source 40, delivering an essentially fixed offset current into the supply line to the DUT. The current source will deliver a given offset current level $I_{DDQoffset}$ to the summing node 41, so that only the $I_{DDQ}$ above this level is drawn from the current measuring unit 6. In that way a flexible virtual measurement window (VMW) 42 is created with a high measurement resolution (FIG. 11). The offset current source is preferably a programmable current source.

The offset level 43 which is delivered as an offset current is programmable and variable during the measurement. It is basically controlled by the operator of the test equipment, through the processing unit 8. Two embodiments are considered, as shown in FIGS. 10a and 10b. In FIG. 10a, the current source 40 is connected to the supply voltage $V_{DUT}$, placing the OCU in parallel to the CMU. However, a parallel connection is not necessary. The offset current unit may for example be connected to the device supply voltage $V_{DD}$ (FIG. 10b). Autoranging sequences are preferably performed prior to applying a series of test vectors, in order to establish the optimal level of the applied offset current. For this purpose, a programmable current source 40 is preferably used.

The offset current unit 21, possibly in combination with a compensated switch 20 according to the invention, can be applied in various ways. In the off-chip current measurement domain, the programmable current source 21 can be implemented either as a stand-alone module (FIG. 12) or it can be part of the off-chip current monitor (FIG. 13). The block 100 in FIGS. 12 to 15 represents an $I_{DDQ}$ monitor with a CMU 6, and preferably with a CBU 20 according to the invention. The off-chip current monitor architecture is of no importance to the windowing concept. In the on-chip domain, again the offset current unit 21 can be an add-on core to the Built-In Current Sensor (BICS) (FIG. 14) or be part of the BICS itself (FIG. 15). The BICS architecture is of no importance to the concept. In all embodiments shown in FIGS. 12-15, the dotted line delineates what is to be understood as the device 1 of the invention.

The (programmable) current source can be controlled by the ATE 8 (FIGS. 12a, 13a, 14a, 15a) or by the on-chip/off-chip $I_{DDQ}$ monitor (FIGS. 12b, 13b, 14b, 15b) and although it is not necessary, the offset current unit can be part of a auto-windowing procedure.

Examples of Measurement Modes Performed by the Processing Unit.

The following measurement modes comprise calculations which are performed by the processing unit itself. Results of calculations (subtraction of $I_{DDQ}$ values, comparison results) are transferred to the ATE 8 which may further process them or display the results on a screen.

Standard $I_{DDQ}$ mode—$I_{DDQ}$ measurements are made and compared against one predefined reference value resulting in a pass/fail result. Pass=measurement is below reference, Fail=measurement is above reference.

Current signatures—this is a special version of the standard $I_{DDQ}$ mode, for a current signature approach, $I_{DDQ}$ measurements are made and compared against a predefined vector related pass/fail reference, resulting in a pass/fail result.

Standard Delta-$I_{DDQ}$ Mode (vector-to-vector Delta)—$I_{DDQ}$ measurements are made, subsequent measurements are subtracted from each other (delta calculation). The measurement is preferably but not necessarily compared against a predefined absolute reference and the calculated delta is compared against a predefined delta reference value, resulting in a pass/fail result. Delta as well as absolute reference(s) can be set either globally or on a vector-to-vector basis.

Vector to reference vector Delta-$I_{DDQ}$ mode—A reference vector is selected of which the related $I_{DDQ}$ measurement serves as reference for the following measurements. Typically the reference vector is the first $I_{DDQ}$ vector (this situation is supported by the standard vector to reference vector delta $I_{DDQ}$ mode firmware).

$I_{DDQ}$ measurements are then made, the measurement result of each subsequent measurement is subtracted from the reference value gathered during the reference vector measurement (delta calculation). The measurement is preferably but not necessarily compared against a predefined absolute reference and the calculated delta is compared against a predefined delta reference value, resulting in a pass/fail result. Delta as well as absolute reference(s) can be set either globally or on a vector-to-vector basis.

Pre and Post stress Delta-$I_{DDQ}$ mode—A first set of $I_{DDQ}$ measurements are made (pre stress), then stress is applied to the device under test, followed by a second set of $I_{DDQ}$ measurements (post stress). The results from the corresponding pre and post stress measurements are subtracted (delta calculation). The measurement is preferably but not necessarily compared against a predefined absolute reference and the calculated delta is compared against a predefined delta reference value, resulting in a pass/fail result. Delta as well as absolute reference(s) can be set either globally or on a vector to vector basis

The invention claimed is:

1. A device for measuring supply current to an electronic device under test, which is powered by a supply voltage, said measuring device being placed in a supply line between said supply voltage and said device under test, said measuring device comprising a current measuring unit, a current bypass unit in parallel to said current measuring unit, wherein said measuring device further comprises an offset current device and a summing node, arranged to receive a current from the current measuring unit and a current from the offset current device and deliver the sum of said currents to the device under test, said offset current device comprising a current source, for providing a constant offset current to said summing node, so that only the supply current level above the constant offset current is drawn from the current measuring unit.

2. A device according to claim 1, wherein said current source is programmable.

3. A device according to claim 1, wherein said current source is coupled in parallel to said current measuring unit.

4. A device according to claim 1, wherein said current source is powered by a supply voltage which is different from the device under test supply voltage.

5. The device according to claim 1, further comprising a processing unit, which is in connection with said current measuring unit and with an output device, and which is able to acquire a supply current measured value from the current measuring unit, wherein the processing unit is able to perform processing actions on said measurement.

6. The device according to claim 5, wherein said processing actions are chosen from the group consisting of:
   subtracting a measured supply current value from a reference value or vice versa,
   comparing a measured supply current value with a reference value and producing a pass/fail signal on the basis of the result of said comparison,
   subtracting a measured supply current value from a previously measured supply current value
   comparing a calculated value, resulting from subtracting a measured supply current value from a previously measured supply current value or vice versa, or from subtracting a measured supply current value from a reference value or vice versa, with a reference value and producing a pass/fail signal on the basis of the result of said comparison.

7. A device according to claim 1, wherein said device is separate from said device under test.

8. A device according to claim 1, wherein said device is incorporated into said device under test.

9. The device according to claim 1, wherein the supply current above the offset current is drawn from the current measurement unit in order to create a virtual measurement window with high measurement resolution.

10. The device according to claim 1, wherein the summing node provides the supply current to the electronic device under test.

* * * * *